United States Patent [19]
Pryor et al.

[11] Patent Number: 5,768,341
[45] Date of Patent: *Jun. 16, 1998

[54] COMMUNICATIONS CHANNEL TESTING ARRANGEMENT

[75] Inventors: Dennis Malcolm Pryor; Michael Challis, both of Swindon, England; Luc Van Leeuw, Herk-de-Stad, Belgium

[73] Assignee: Raychem Limited, London, United Kingdom

[ * ] Notice: The term of this patent shall not extend beyond the expiration date of Pat. No. 5,604,785.

[21] Appl. No.: 436,318

[22] PCT Filed: Nov. 10, 1993

[86] PCT No.: PCT/GB93/02312

§ 371 Date: Aug. 17, 1995

§ 102(e) Date: Aug. 17, 1995

[87] PCT Pub. No.: WO94/11948

PCT Pub. Date: May 26, 1994

[30] Foreign Application Priority Data

Nov. 12, 1992 [GB] United Kingdom ............... 9223770

[51] Int. Cl.$^6$ ............... H04M 1/24; H04M 3/08; H04M 3/22
[52] U.S. Cl. ............... 379/22; 379/2; 379/27; 379/29; 324/522
[58] Field of Search ............... 379/22, 27, 399, 379/400, 412, 413, 1, 2, 8, 26, 29, 30, 31, 32, 102, 28; 324/522

[56] References Cited

U.S. PATENT DOCUMENTS

| | | | |
|---|---|---|---|
| 4,169,220 | 9/1979 | Fields | 179/175.3 R |
| 4,710,949 | 12/1987 | Ahuja | 379/26 |
| 4,947,427 | 8/1990 | Rosch et al. | 379/412 |
| 4,964,160 | 10/1990 | Traube et al. | 379/412 |
| 5,146,384 | 9/1992 | Markovic et al. | 379/412 |
| 5,604,785 | 2/1997 | Pryor et al. | 379/2 |
| 5,617,466 | 4/1997 | Walance | 379/28 |
| 5,652,575 | 7/1997 | Pryor et al. | 340/825.77 |
| 5,661,776 | 8/1997 | Charland | 379/29 |

FOREIGN PATENT DOCUMENTS

| | | | |
|---|---|---|---|
| 3513598 | 10/1986 | Germany | H04M 3/30 |
| 2149274 | 6/1985 | United Kingdom | H04M 3/22 |
| WO 92/10878 | 6/1992 | WIPO | H03K 17/08 |
| WO 93/01639 | 1/1993 | WIPO | H02H 3/087 |
| WO 94/01960 | 1/1994 | WIPO | H04M 3/30 |
| WO 94/01961 | 1/1994 | WIPO | H04M 3/30 |
| WO 94/11936 | 5/1994 | WIPO | H02H 9/02 |

OTHER PUBLICATIONS

Search Report for International Application No. PCT/GB93/02312, mailed Jan. 28, 1994.
Search Report for British Application No. 9223770.0.

*Primary Examiner*—Curtis Kuntz
*Assistant Examiner*—Binh K. Tieu
*Attorney, Agent, or Firm*—Herbert G. Burkard

[57] ABSTRACT

A switching arrangement that can be connected in a communications channel that comprises a pair of lines between sets of terminal equipment, which comprises: (i) a series switch (1,2) for connection in each of the lines; (ii) a shunt switch for connection between the lines; and (iii) a control circuit (5) that can actuate the series switches (1,2) and can actuate the shunt switch on receipt of a signal sent along the channel: wherein the control circuit (5) can actuate the shunt switch and the series switches (1,2) on receipt of one or more signals but the shunt switch will remain closed over a different time period than that during which the series switches remain open, in order to allow different tests to be performed on the channel, and wherein one or more of the switches comprises a solid state switch.

18 Claims, 7 Drawing Sheets

| FIG. 2a | FIG. 2b | FIG. 2c |

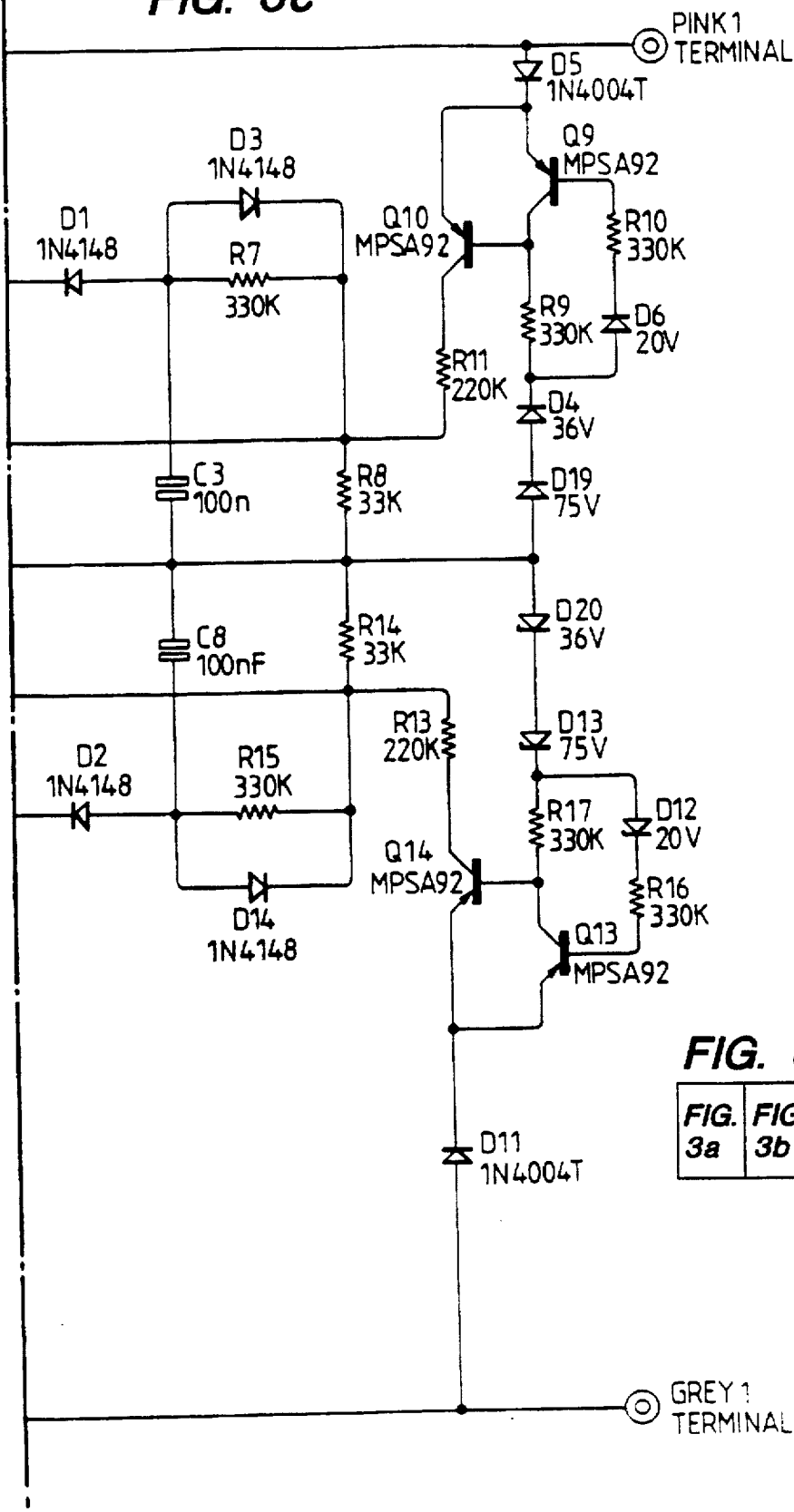

COMMUNICATIONS CHANNEL TESTING ARRANGEMENT

BACKGROUND OF THE INVENTION

1. Field of the Invention

This invention relates to communications or other circuits, and especially to maintenance termination units for use in telecommunications circuits such as telephone circuits.

2. Introduction of the Invention

In recent years, and especially in view of deregulation of many telephone systems, privately owned communication equipment has increasingly been installed in the premises of subscribers to the system, with the result that it is often necessary to determine whether any fault is located in the telephone line, or in the subscriber's premises, i.e. in the subscriber's equipment or cabling, in order to determine whose responsibility it is to repair the fault. It is highly advantageous economically if this determination can be performed remotely by sending an appropriate signal from the local exchange along the line, thereby obviating the necessity to send any telephone company personnel to the subscriber's premises.

In order to test the telephone line for any faults it is necessary firstly to install a so-called "maintenance termination unit" or MTU in the line at the subscriber's premises which can disconnect the subscriber equipment from the line (often called sectionalizing the line) and connect the a and b or tip and ring lines on receipt of the appropriate signals from the exchange. During the line testing procedure determinations will typically be made of the line to line resistance and of the first and second line to ground resistance. Also the line continuity can be determined by detecting the presence of the MTU electronically.

Various forms of MTU are described in the prior art, and may employ solid state (such as silicon) switches or electrical relays. Solid state switching devices are preferably used in the present invention in view of their greater reliability and lower costs as compared with arrangements that incorporate relays. A number of such devices are described, for example, in U.S. Pat. No. 4,710,949 to Om Ahuja. This device comprises a pair of voltage sensitive switches, one located in each of the tip and ring lines, and a distinctive termination connecting the tip and ring lines on the subscriber side of the voltage-sensitive switches. The voltage-sensistive switches may each have a threshold voltage of about 16 volts so that they are closed in normal operation by the 48 volt battery voltage but will open when this is replaced by a test voltage below about 32 volts in order to test the line-to-ground and tip-to-ring impedances. The distinctive termination may, for example, comprise a back-to-back diode and Zener diode which will exhibit an asymmetric resistance when large voltages (higher than the operating voltages) of different polarity are applied.

Although this form of MTU will perform adequately to sectionalize a fault in a line, it suffers from the problem that it requires the provision of ringing by-pass capacitors in the signal path in parallel with the voltage-sensitive switches. These capacitors are necessary because the amplitude of the ringing signal (about 80V RMS) which is superimposed on the 48V DC battery voltage, is sufficiently large for the polarity of the resultant signal to change during the ringing signal cycles and to cause unacceptably large crossover distortion due to opening of the voltage-sensistive switches, at the crossover points of the ringing signal. Because the ringing frequency is relatively low, about 20 Hz, a large capacitance is required for the ringing by-pass capacitors, typically in the order of 1.0 μF. Because the capacitors are connected in the signal line they need to have a high voltage rating in order to withstand normal electrical transients, etc; which increases their cost and physical size. In addition they can provide a low impedance path for transients.

Also, to use the voltage-sensitive switches of the prior art line measurements are in general carried out at about 10V. Unfortunately, low voltage measurements suffer from inaccuracies due to electrical noise picked up from such sources as adjacent power or communication lines or from corroded terminals that produce a battery-like e.m.f. in addition to thermal noise.

This problem is overcome according to our copending British patent application No. 9213980.7 which claims a switching arrangement that can be connected in a communications channel that comprises a pair of lines between sets of terminal equipment, for example between a subscriber and an exchange, which comprises:

(i) a DC voltage window detector circuit (referred to herein as a window detector circuit or simply as a window circuit) that is connected between the lines and is responsive to the voltage between the lines; and (ii) one or more switching circuits connected in or between the lines that can be actuated by the window detector circuit when, and only when, the voltage between the lines is within a predetermined band.

so that the or each switching circuit can be remotely actuated by means of a DC signal on the line, the arrangement including a low pass filter associated with the or each switching circuit having a cut off frequency that is sufficiently low to prevent the switching circuit(s) being actuated by a ringing signal on the channel.

In addition, our copending British patent application No. 9213992.2 claims:

A switching arrangement that can be connected in a communications channel comprising a pair of lines, between sets of terminal equipment, which comprises:

(i) a pair of series switching circuits, each of which can be series connected in one of the lines and will open when subjected to an overcurrent in its associated line; and/or (ii) one or more shunt switching circuits connected between the lines, or between one or both the lines and earth, and will close when subjected to an overvoltage in its associated line;

wherein the or each switching circuit can be remotely actuated by means of a test signal sent along the channel.

GB 2030820 (Fields) discloses a remotely-actuated line testing block. When a test voltage of a first polarity from a central office is applied across one of the tip and ring wires of a telephone circuit a capacitor is charged. Upon release of the test voltage the capacitor activates a first switch which connects the tip and ring together. The capacitor activates a second switch which disconnects the subscriber's equipment. The first switch releases after about half of a test interval with the second switch releasing at the end thereof to restore normal line connections. The switches are mechanical relays.

SUMMARY OF THE INVENTION

We have now devised various improvements to such switching arrangements.

Thus, the invention provides a switching arrangement that can be connected in a communications channel that comprises a pair of lines between sets of terminal equipment, which comprises:

(i) a series switch for connection in each of the lines;

(ii) a shunt switch for connection between the lines; and (iii) a control circuit that can actuate the series switches and can actuate the shunt switch on receipt of a signal sent along the channel;

wherein the control circuit can actuate the shunt switch and the series switches on receipt of one or more signals but the shunt switch will remain closed over a different time period than that during which the series switches remain open, in order to allow different tests to be performed on the channel, and wherein one or more of the switches comprises a solid state switch.

The invention also provides a switching arrangement that can be connected in a communications channel that comprises a pair of lines between sets of terminal equipment, which comprises:

(i) a series switch for connection in each of the lines and which will switch to an open state when subjected to an overcurrent;

(ii) a shunt switch for connection between the lines; and (iii) a control circuit that can actuate the series switches and can actuate the shunt switch on receipt of a signal sent along the channel;

wherein the control circuit can actuate the shunt switch and the series switches on receipt of one or more signals, but the shunt switch will remain closed over a different time period than that during which the series switches remain open, in order to allow different tests to be performed on the channel.

The invention further provides a switching arrangement that can be connected in a communications channel that comprises a pair of lines between sets of terminal equipment, which comprises:

(i) a series switch for connection in each of the lines;

(ii) a shunt switch for connection between the lines; and (iii) a control circuit connected between the lines of the communications channel and that can actuate the series switches and can actuate the shunt switch on receipt of a signal sent along the channel;

wherein the control circuit can actuate the shunt switch and the series switches on receipt of one or more signals, but the shunt switch will remain closed over a different time period than that during which the series switches remain open, in order to allow different tests to be performed on the channel.

In another embodiment the invention provides a switching arrangement that can be connected in a communications channel that comprises a pair of lines between sets of terminal equipment, which comprises:

(i) a series switch for connection in each of the lines;

(ii) a shunt switch for connection between the lines; and (iii) a control circuit comprising a DC voltage window detector circuit that is connected between the lines and is responsive to voltage between the lines and that can actuate the series switches and can actuate the shunt switch on receipt of a signal sent along the channel;

wherein the control circuit can actuate the shunt switch and the series switches on receipt of one or more signals, but the shunt switch will remain closed over a different time period than that during which the series switches remain open, in order to allow different tests to be performed on the channel.

The invention also provides a switching arrangement that can be connected in a communications channel that comprises a pair of lines between sets of terminal equipment, which comprises:

(i) a series switch for connection in each of the lines;

(ii) a shunt switch for connection between the lines; and (iii) a control circuit that can actuate the series switches and can actuate the shunt switch on receipt of a signal sent along the channel;

wherein the control circuit can actuate the shunt switch and the series switches on receipt of one or more signals, but the shunt switch will remain closed over a different time period than that during which the series switches remain open, in order to allow different tests to be performed on the channel; and either (a) the shunt switch is intended to be located on the exchange side of the series switches, and, after the switches have been actuated by the control circuit, the shunt switch will open before the series switches close; or (b) the shunt switch is intended to be located on the subscriber side of the series switch, and after the switches have been actuated by the control circuit, the series switches will close before the shunt switches open.

The invention yet further provides a switching arrangement that can be connected in a communications channel that comprises a pair of lines between sets of terminal equipment, which comprises:

(i) a series switch for connection in each of the lines;

(ii) a voltage generator that normally, biases the switches closed, the voltage generator taking power from the voltage between the lines; and (iii) a control circuit that controls the current input to the voltage generator, the control circuit being capable of opening the series switches by interrupting current to the voltage generator in response to a signal sent along the communications channel.

DETAILED DESCRIPTION OF THE INVENTION

In the invention described in British application No. 9213980.7, series switches in the lines are opened for subscriber disconnect tests (e.g. line-to-line and line-to-ground resistance) and the shunt switch is closed for a loop back test, on receipt of different signals from the exchange, for example on receive of DC signals of different polarity. This, however, can cause a problem during testing if the tip and ring (a and b) line have inadvertently been reversed when installed, and where that problem is likely, we prefer that both the shunt and series switches are activated on receipt of a single signal.

Even where separate signals are used for the two tests, the different durations of the series and shunt switch activations can be desirable. This is because the two types of testing will in general take different lengths of time, the loop-back test being quicker than the disconnect test.

The invention then has the advantage that, since both types of test can be performed after receipt of a single signal, e.g. a DC voltage applied between the lines, it is possible to perform the tests without the polarity of the signal being important.

The arrangement may be formed in a number of configurations. For example the shunt switch may be intended to be located on the exchange side of the series switches, in which case, after the switches have been actuated by the control circuit (to close the shunt switch and open the series switches), the shunt switch will open before the series switches close. This allows a loop back test to be carried out first and then an insulation test to be carried out. Alternatively, the shunt switch may be intended to be located on the subscriber side of the series switches, in which case, after the switches have been actuated by the control circuit, the series switches will close before the shunt switch opens. This allows an insulation test to be carried out, followed by a loop-back test.

In the broadest aspect of the invention the arrangement may be operated by a range of signals. e.g. AC signals of a predetermined frequency or by a DC signal. Preferably the arrangement responds to a DC signal as in the case of our copending British applications mentioned above, in which case the control circuit preferably includes a window detector circuit.

Normally the window detector circuit will allow current to flow through it only when the line voltage is within a predetermined band (which will be above normal signaling voltages), i.e. the current that flows through the window circuit is significantly greater when the line voltage is within the band than when it is outside the band, although at very high applied line voltages the leakage current through the window circuit may approach or even exceed the within-band current flow.

The window detector circuit that determines the applied voltage at which the switches will open and close may include a Zener diode that sets the lower limit of the applied voltage that will cause current to flow. The upper limit of the applied voltage may conveniently be set by means of an overcurrent switching circuit that will open when the current passing through the circuit, and hence the voltage applied across it, exceeds a predetermined value, or it may include a further zener diode.

Preferably the control circuit is located on the subscriber side of the series switches. Such an arrangement has the advantage that, when the switches are opened for a subscriber disconnect test, the leakage current can be reduced to a very low value. e.g. below 50 μA and especially below 10 μA. This may be achieved by including a pair of capacitors in the control circuit which are charged when the appropriate signal is received from the exchange, and will then be discharged in order to actuate the switches (this discharge preferably using circuits having different time constants in order to actuate the shunt and series switches for different lengths of time).

In addition to the ability of the arrangement to be operated in order to locate a fault in the channel, it is possible according to a preferred aspect of the invention, for the circuits to be capable of protecting the system from overcurrents and overvoltages by opening and closing respectively. This can be achieved by employing the switches described below.

The series switch in each of the lines is a solid state switch, normally formed in silicon. In one form of arrangement, the switches may comprise a switching transistor whose input voltage is controlled by an overcurrent control element which switches on when the switching circuit is subjected to an overcurrent, thereby turning the switching transistor off. Such a circuit on its own will only switch in response to an overcurrent in its associated line. However, the circuit may include a test control element that also controls the input voltage of the switching transistor. The test control element turns, on when current flows in the window circuit, thereby turning the switching transistor off. Thus, in this way the series switching circuits can be actuated either remotely or by an overcurrent in the line. The control elements may be formed from any of a number of devices, and the choice of control element will depend to some extent on the type of switching transistor employed.

The overcurrent control element may, for example, comprise a transistor whose base or gate is held in a potential divider that spans the switching transistor so that the base-emitter or gate-source voltage increases as the current in the line increases. Alternatively the control element may comprise a comparator that compares a fraction of the voltage across the switching transistor with a reference voltage and opens the switch if the fraction is greater than the reference voltage, as described in our copending international application No. PCT/GB91/02215. If a normally-on FET such as a JFET or a depletion mode MOSFET is employed as the switching transistor, a negative voltage generator. e.g. a charge pump, or an optocoupler may be employed as the control element, as described in our copending British application No. 9114717.3 The disclosures of these specifications are incorporated herein by reference.

A particularly preferred form of series switch that can be used in the present invention is described in our British patent application No. 9223773, entitled "Switching Arrangement", the disclosure of which is incorporated herein by reference. That arrangement comprises an arrangement for connection in an electrical circuit, which comprises:

(1) a pair of FETs that are series connected in a line of the circuit with their sources connected together or with their drains connected together and whose states can be altered by means of a voltage acting on their gates; and (2) a control connected to the gate of at least one of the FETs;

the control being responsive to an overcurrent on the line thereby altering the states of at least one of the FETs.

Preferably it comprises a pair of n-channel enhancement mode MOSFETs whose gates are connected to a voltage generator. When a voltage is applied to the gates the switch will be closed (current flowing through the reverse biased FET due to its parasitic diode), and when the voltage is removed the switch will be open. A pair of control transistors are preferably connected between the source and gate of the MOSFETs and are preferably controlled by the voltage appearing across the arrangement so that they will cause the arrangement to open when an overcurrent is experienced. We prefer that the control resistors or other control causes $V_{GS}$ of at least one n-channel FET to decrease as $V_{DS}$ of that FET increases, thereby causing that FET to exhibit foldback behavior. Alternatively the control can cause $V_{GS}$ of at least one p-channel FET to increase as $V_{DS}$ of that FET increases thereby causing that FET to exhibit foldback behavior. The foldback process can therefore provide positive feedback.

Preferably all components of the arrangement take their power from the current in the lines or from the voltage drop between them so that no separate power supply rails are needed.

It is quite possible to produce a number of arrangements each having a different AC actuation voltage window so that they can be connected at various points along a long channel in order to divide the channel into sections for locating a fault.

BRIEF DESCRIPTION OF THE DRAWINGS

One form of arrangement according to the present invention will now be described by way of example with reference to the accompanying drawings in which.

DETAILED DESCRIPTION OF THE DRAWINGS

Figure 1:
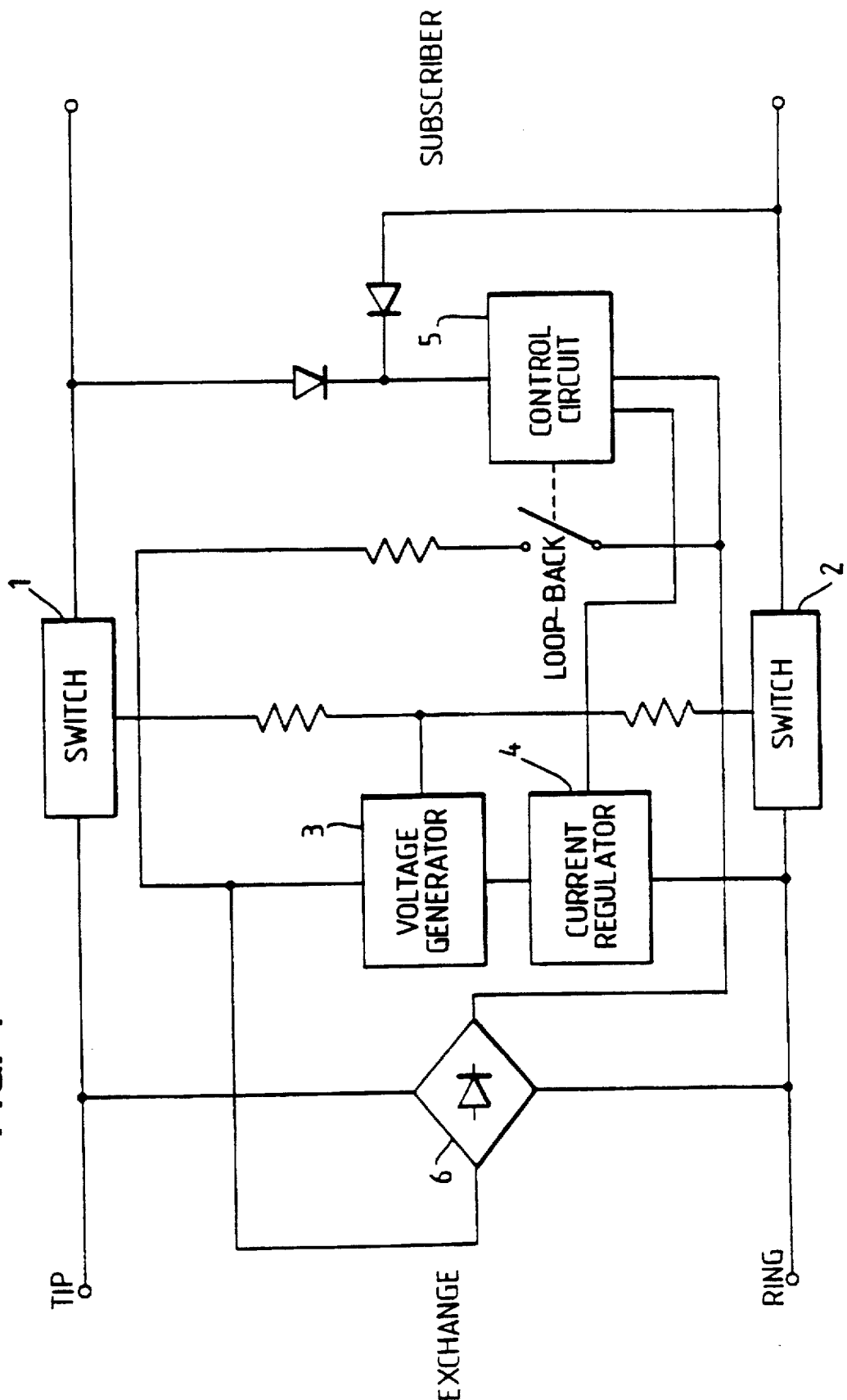
FIG. 1 is a block diagram of an arrangement according to the invention.

Referring to the accompanying drawings, FIG. 1 is a block diagram of an MTU circuit according to the invention. It consists of two series switches 1 and 2 connected in the line to provide a subscriber disconnect function as well as a protection function. These switches are biased into conduction by a voltage generator 3 which is powered from the line, on the exchange side of the MTU. The series switches are bidirectional and can therefore work for any polarity of voltage that may appear on the line. The voltage generator which provides the biasing voltage for the switches is regulated by a current regulator circuit 4 which limits a current that can be supplied to the voltage generator 3.

The MTU function of the circuit is activated by a control circuit 5 which interprets a valid activation voltage that appears on the line and if it is the correct voltage it sends a signal to open the series switches 1 and 2 and to place a loopback resistance in the line for loopback measurement. The loopback resistance enables the resistance of the line to be measured. The loopback function is carried out by turning on a transistor switch that is series connected to the loopback resistor across the line, via the bridge rectifier 6. The subscriber disconnect function is carried out by turning on a transistor in order to disable the current regulating circuit 4 which then removes the supply current from the voltage generator 3. This action causes the output of the voltage generator 3 to fall to zero, removing bias from the series switches 1 and 2, and thus opening them.

The control circuit 5 sends out the two signals for a different period of time. One signal is for the subscriber disconnect function and the other is for the loopback function. Both signals are active for X seconds (preferably 2 to 10 especially about 5) so that the loop resistance can be measured with the subscriber disconnected. After X seconds the the loop resistor is disconnected from the line and a line insulation resistance measurement can be made. After a total of Y seconds (preferably 10-30, especially about 15), where X is less than Y (preferably from one half to one quarter, especially about one third), the control signal is reduced to zero and the voltage generator 3 starts to operate, turning on the series switches 1 and 2, and reconnecting the subscriber to the exchange.

The control circuit 5 sends out a control signal when a valid DC voltage, of either polarity, is on the line. In order to operate the MTU the activation voltage must be between an upper and a lower voltage limit for the control circuit to operate. This is defined as the window voltage. The circuit has a low pass filter built into it to ignore the AC ringing voltage on the line.

When a valid activation voltage, within the window, is present on the line a timing circuit charges up so that the switches may be activated for X and Y seconds. The switches are not actually actuated until the voltage across the lines is out of the upper and lower limit of the window. This is to allow the capacitors in the timing circuits to charge up. Once the voltage has been increased or decreased out of the window the test functions will actuate.

Overcurrent protection for the subscriber (or for the exchange) may be incorporated into the series switches if required. Standard overvoltage protection components may be placed before the MTU to protect the MTU (and the subscribers) from any overvoltage spikes that may appear on the line.

Figure 2A:
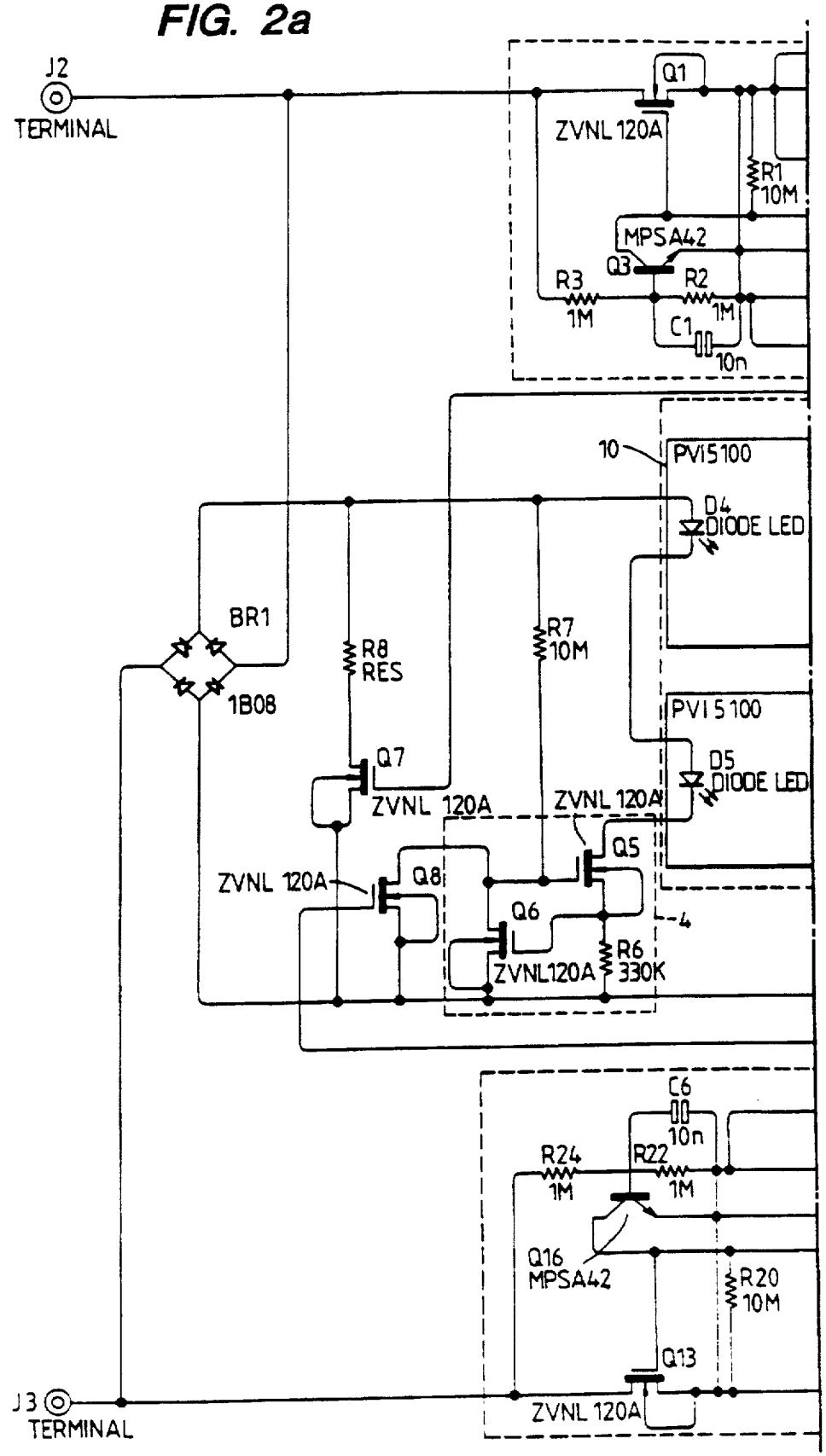
FIG. 2 is a circuit diagram of an arrangement as shown in FIG. 1.
Figure 2B:
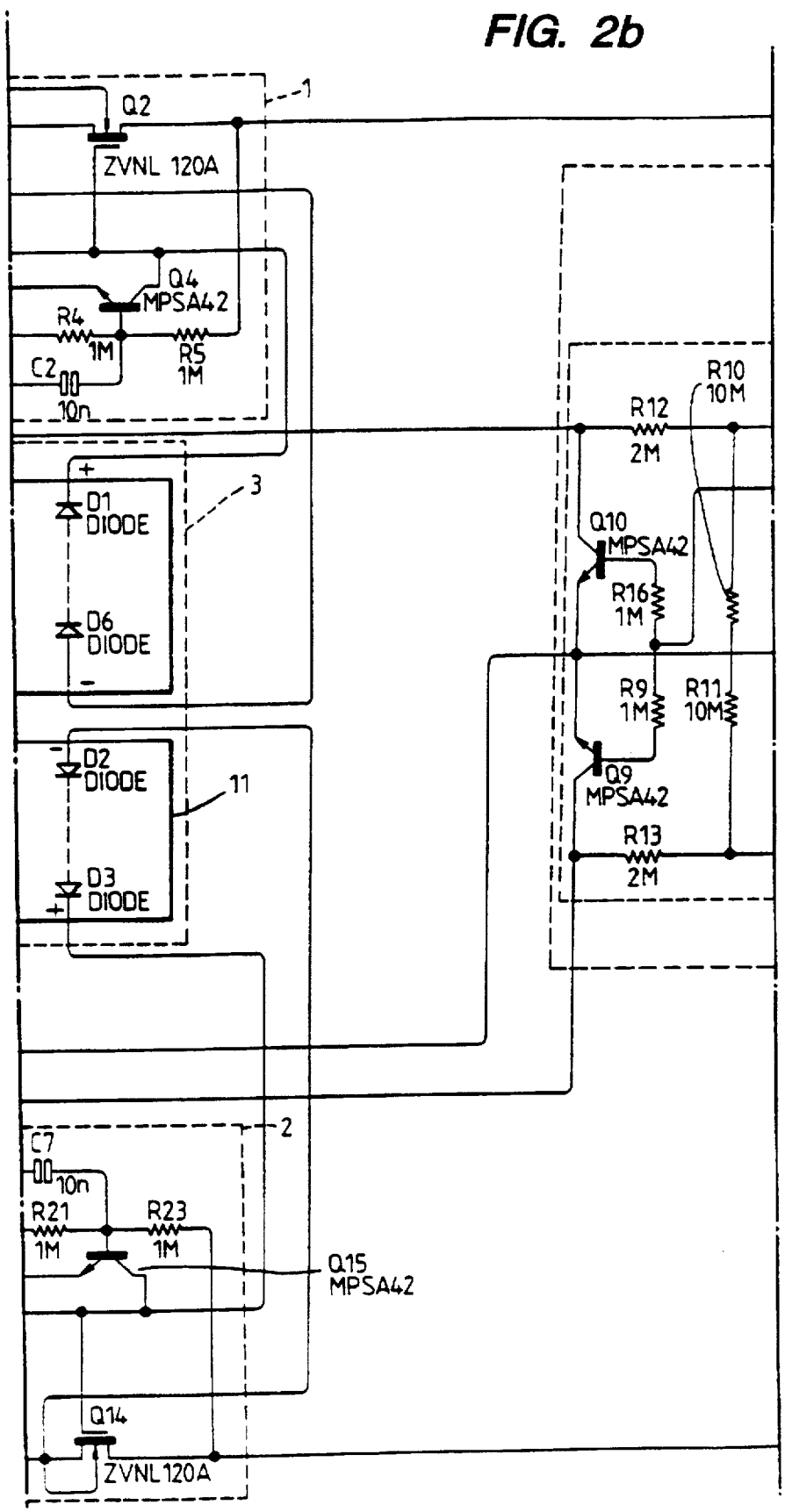
Figures 2, 2C:
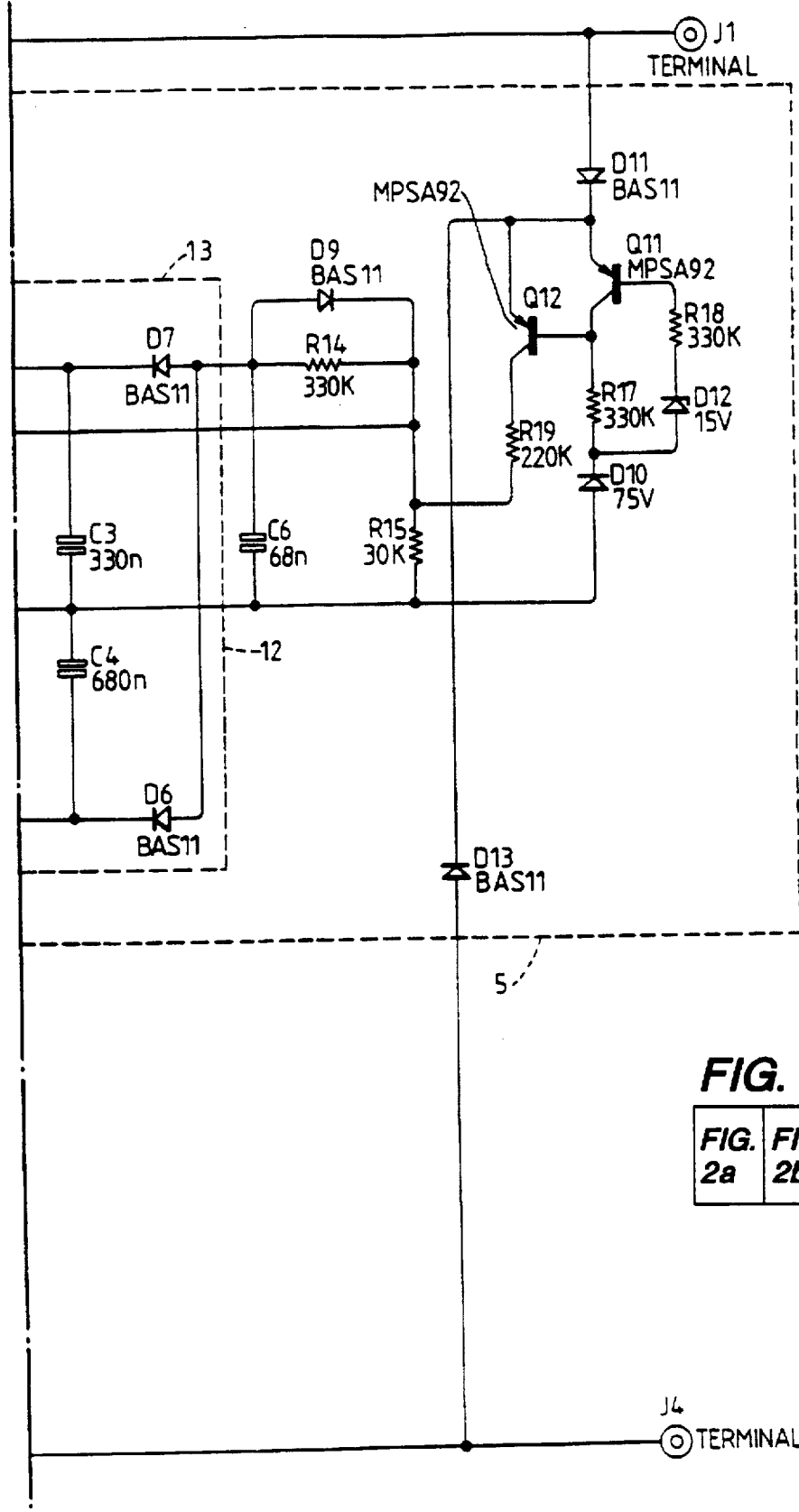

FIG. 2 is one possible circuit diagram of the arrangement shown in FIG. 1.

The series switching element in the tip line is described below. The one in the other line is identical in operation.

The two series switches 1 and 2 may be identical, the switching circuit 1 comprising for example two n-channel field effect transistors Q1 and Q2 connected with their sources together such that one transistor is always forward biased and the other reversed biased (although which is which will depend on the polarity of the voltage on the line). In reverse bias the line current will flow through the "parasitic" drain source diode of the FET, giving a very low voltage drop. This allows the circuit to exhibit a linear AC characteristic. The forward biased transistor has its gate biased on by the voltage generator circuit. The voltage generator circuit produces a voltage that is higher than the source voltage plus the gate threshold of the FET in order to bias the FET on. The purpose of resistor R1 is to tie the gate of the FET to the source so that the gate terminal does not float.

Two bipolar overcurrent control transistors Q3 and Q4 have their collectors and emitters connected to the gates and sources of the FET switching transistors. When an overcurrent occurs on the line, a voltage will develop across the main switching transistor. This voltage is connected to the base of the overcurrent control transistors by the voltage dividers R3 and R2 spanning Q3 and R4 and R5 spanning Q4. When the voltage at the base of the overcurrent control transistor rises to 0.7 of a volt, the transistor will turn on and will short the gate of the switching transistor to its source, thus turning the switching transistor off. Capacitors C1 and C2 are provided to prevent the circuit from switching off when power is initially applied to the line. They also prevent spurious current spikes that normally appear on the line from activating the overcurrent control transistors.

Once the FET has been "tripped" into its high resistance state, all of the voltage available appears across it. This has the effect of latching the overcurrent protection into the high resistance state, until either the supply is removed, or the load is removed momentarily from the circuit (such as the phone being placed onhook).

The voltage generator circuit 3 consists of two opto-isolators 10 and 11. These have an LED input which is powered from the line, via bridge rectifier BR1, and the current regulating circuit. The LED will emit light onto the photovoltaic diodes and a voltage will be generated at the terminals of these diodes. This voltage is then fed to the gate and source terminals of switching transistors Q1 and Q2 in the case of diodes D1 and D6, and to the source and gate terminals of switching transistors Q13 and Q14 in the case of diodes D2 and D3. This has the effect of biasing the forward biased switching transistors into conduction.

The current regulating circuit 4 regulates the supply current to the voltage generator circuit. The current regulating circuit consists of transistors Q5 and Q6, and resistors R7 and R6. Resistor R7 provides gate bias to transistor Q5, so that Q5 will conduct. Resistor R6 is a current sense resistor such that when the maximum supply current required by the voltage generator circuit is reached, a voltage equal to the gate voltage of transistor Q6 will be developed across it. This has the effect of turning transistor Q6 partly ON which removes voltage from the gate of transistor Q5. The drain source resistance of Q5 will increase because of this and the current will be limited to the value required by the voltage generator circuit.

A window detector circuit is connected between the lines, on the subscriber side of the MTU and is part of the control circuit. It comprises transistors Q11 and Q12, zener diodes D10 and D12, resistors R15, R17, R18 and R19, and some steering diodes to connect the circuit to the line. When a voltage of, say, between 75V and 90V appears on the line, which is the test activation voltage, base current will flow out of transistor Q12 and through zener diode D10, thus turning Q12 on. If the voltage is above 90V then base current will flow out of transistor Q11 and through zener diode D12 thus turning Q11 on. This has the effect of removing base drive from transistor Q12, turning it off. This means that transistor Q12 conducts for a voltage between the lines of 75V to 90V (the window voltage).

When transistor Q12 conducts, a current will flow through resistors R15 and R19. The current flowing through these resistors will cause a voltage to be developed across resistor R15 and this voltage is passed onto the timed test control circuits 12 and 13 via a low pass filter formed by capacitor C5, resistor R14 and diode D9 in parallel with R14. When the unit is subjected to a ringing signal a train of unipolar pulses of short duration is developed across resistor R15. The purpose of diode D9 is to enable capacitor C5 to discharge faster than it is charged when the low pass filter is subjected to this train of pulses and so limits the voltage developed across capacitor C5 to about 0.7 of a volt.

The filtering circuit is connected to a timing element, formed by capacitor C4 and resistor R11 in the remote disconnect test control circuit 12, by diode D8. Diode D8 allows the timing element to charge quickly, but prevents it discharging through the same path that it was charged from. The timing element is connected to the test control transistor Q8 via resistor R13.

When a valid activation voltage of between 75V and 90V is applied to the line the timing capacitors will start to charge. At the same time current will flow through resistor R9, which is connected to the window circuit resistor R15, such that base current will flow into the base of transistor Q9, turning it on. This has the function of shorting the gate of the test control transistor Q8 to its source, preventing it from carrying out the test function. As soon as the valid activation voltage is removed from the line transistor Q9 will cease to conduct, and the voltage at the timing element formed by capacitor C4 and resistor R11 will cause transistor Q8 to turn on. Q8 remains on for as long as capacitor C4 remains charged above the gate voltage of Q8. The purpose of having transistor Q9 is to allow the timing capacitor to charge before opening the series switches.

When transistor Q8 is turned on it has the effect of removing gate drive from the current regulating transistor Q5, turning Q5 off. This stops the current flowing through the voltage generator circuit, removing bias from the series switches, thus opening the series switches, for a period of time defined by the timing circuit.

The other timed test control circuit 13, for the loopback element, operates in a similar fashion, but the capacitor size of the timing element is half that of the remote disconnect timed test control circuit. This means that the loopback function will be activated for half of the time of the disconnect function. When a valid activation voltage is present on the line capacitor C3 will charge. When the activation voltage is removed transistor Q10 will turn off in a similar fashion to Q9 in the other circuit, and the voltage at the timing element formed by capacitor C3 and resistor R10 will be connected to the gate of test control transistor Q7, via resistor R12. Test control transistor Q7 will turn on, connecting the loopback resistance R8 into the line, providing the loopback function.

In this circuit the duration of the loopback function is half that of the subscriber disconnect function. This enables the line resistance to be measured with the subscriber disconnected, and then the insulation resistance of the line to be measured, without anything else connected across the lines.

Figure 3A:
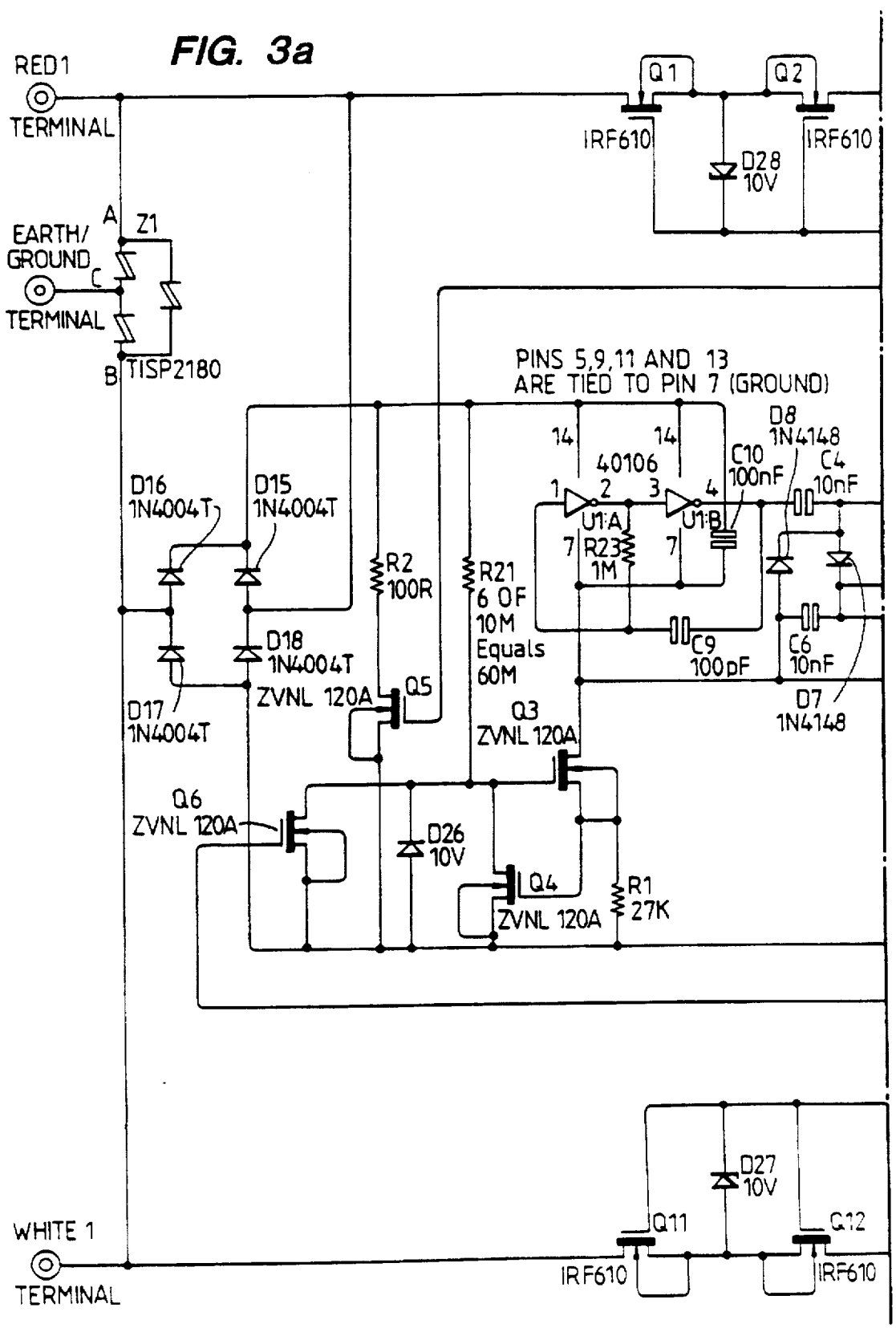
FIG. 3 is a circuit diagram of an alternative arrangement as shown in FIG. 1.
Figure 3B:
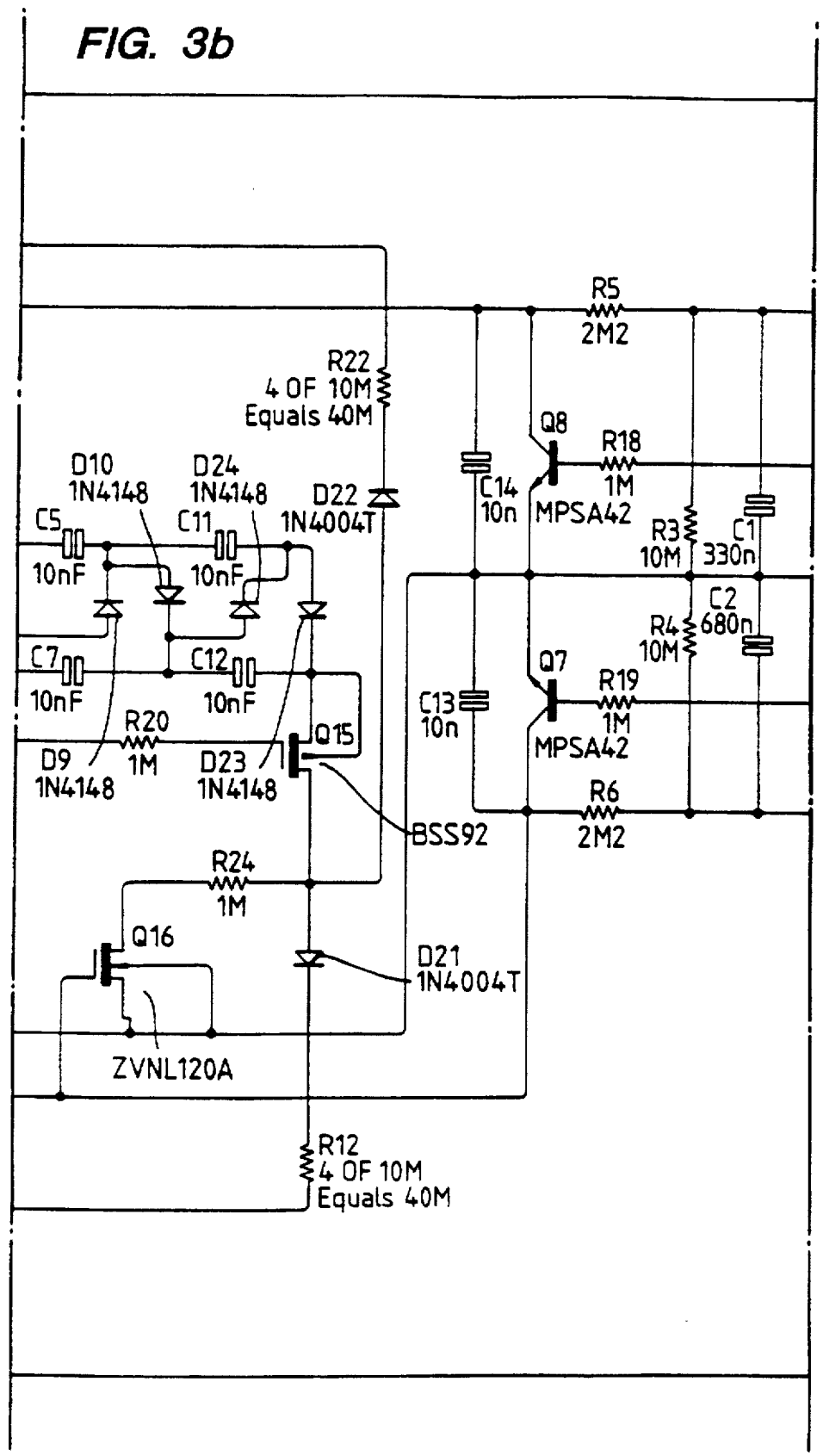

The circuit shown in FIG. 3 is similar to that shown in FIG. 2 except that charge pumps are used as the voltage generators instead of optoisolators. An advantage of such charge pumps is a reduced supply current, of say, 30 microamps. Also a reduced voltage drop across the series switches can be achieved if the overcurrent protection circuitry is omitted.

We claim:

1. A switching arrangement which can be connected in a communications channel, the communications channel comprising a pair of lines, the switching arrangement, which, in use, is connected between sets of terminal equipment, and which comprises:

(i) first and second series switches, each of which, in use, is series connected in one of the lines;

(ii) a shunt switch which, in use, is connected between the lines; and (iii) a control circuit which can actuate the series switches and can actuate the shunt switch on receipt of a signal sent along the channel;

wherein (a) the control circuit can actuate the shunt switch and the series switches on receipt of one or more signals, (b) the shunt switch will remain closed over a different time period than that during which the series switches remain open, in order to allow different tests to be performed on the channel, and (c) at least one of the following conditions is present:

(1) one or more of the switches comprises a solid state switch, (2) the series switch will switch to an open state when subjected to an overcurrent, (3) the control circuit, in use, is connected between the lines of the communications channel, and (4) the control circuit comprises a DC voltage window detector circuit that is connected between the lines and is responsive to voltage between the lines.

2. An arrangement according to claim 1, in which the solid state switch comprises a switching transistor.

3. An arrangement according to claim 1, in which at least one of the series switches comprises a pair of FETs, each FET comprising a source, a drain, and a gate.

4. An arrangement according to claim 3, in which the FETs (a) comprise enhancement mode FETs with their sources connected together, and (b) can be biased into conduction by means of a voltage source acting on their gates.

5. An arrangement according to claim 3, in which at least one of the series switches additionally comprises a pair of control transistors, each control transistor being connected between the gate and source of one of the FETs.

6. An arrangement according to claim 5, in which each control transistor is held in a voltage divider that spans the series switch.

7. A switching arrangement which can be connected in a communications channel, the communications channel comprising a pair of lines, the switching arrangement which in use is connected between sets of terminal equipment, and which comprises:

(i) first and second series switches, each of which, in use, is series connected in one of the lines, said series switch having an exchange side and a subscriber side;

(ii) a shunt switch which, in use, is connected between the lines; and (iii) a control circuit which can actuate the series switches and can actuate the shunt switch on receipt of a signal sent along the channel;

wherein (1) the control circuit can actuate the shunt switch and the series switches on receipt of one or more signals, (2) the shunt switch will remain closed over a different time period than that during which the series switches remain open, in order to allow different tests to be performed on the channel, and (3) either (a) the shunt switch in use is located on the exchange side of the series switches, and, after the shunt switch and series switches have been actuated by the control circuit, the shunt switch will open before the series switches close; or (b) the shunt switch in use is located on the subscriber side of the series switch, and after the shunt switch and series switches have been actuated by the control circuit, the series switches will close before the shunt switch opens.

8. An arrangement according to claim 7, in which the control circuit bridges the pair of lines on the subscriber side of the shunt switch.

9. An arrangement according to claim 7, in which the control circuit bridges the pair of lines on the subscriber side of the shunt switch and the series switches.

10. An arrangement according to claim 1, in which both the shunt switch and the series switches are activated on receipt of a single signal.

11. An arrangement according to claim 1 wherein the series switch has an exchange side and a subscriber side, the shunt switch, in use, is located on the exchange side of the series switch, and, after the switches have been actuated by the control circuit, the shunt switch will open before the series switches close.

12. An arrangement according to claim 1, wherein the series switch has an exchange side and a subscriber side, the shunt switch, in use, is located on the subscriber side of the series switch, and, after the switches have been actuated by the control circuit, the series switches will close before the shunt switches open.

13. An arrangement according to claim 1, wherein the series switches are controlled by a voltage generator that takes its power from voltage appearing between the lines, the voltage generator being controlled by the control circuit.

14. A switching arrangement which can be connected in a communications channel, the communications channel comprising a pair of lines, the switching arrangement, which, in use, is connected between sets of terminal equipment, and which comprises:

(i) first and second series switches, each of which, in use, is series connected in one of the lines;

(ii) a voltage generator that normally biases the series switches closed, the voltage generator taking power from the voltage between the lines;

(iii) a control circuit that controls the current input to the voltage generator, the control circuit being capable of opening the series switches by interrupting current to the voltage generator in response to first signal sent along the communications channel; and (iv) one or more shunt switches connected between the lines, which shunt switch can activate in response to second signal sent along the communications channel.

15. An arrangement according to claim 7, in which both the shunt switch and the series switches are activated on receipt of a single signal.

16. An arrangement according to claim 7 wherein the series switch has an exchange side and a subscriber side, the shunt switch, in use, is located on the exchange side of the series switch, and, after the switches have been actuated by the control circuit, the shunt switch will open before the series switches close.

17. An arrangement according to claim 7 wherein the series switches each have an exchange side and a subscriber side, the shunt switch, in use, is located on the subscriber side of the series switches, and, after the shunt switch and series switches have been actuated by the control circuit, the series switches will close before the shunt switches open.

18. An arrangement according to claim 7, wherein the series switches are controlled by a voltage generator that takes its power from voltage appearing between the lines, the voltage generator being controlled by the control circuit.

* * * * *